United States Patent
Polak et al.

[11] Patent Number: 6,030,684
[45] Date of Patent: Feb. 29, 2000

[54] PROTECTING ELECTRONIC COMPONENTS IN ACIDIC AND BASIC ENVIRONMENT

[75] Inventors: Anthony J. Polak, Lake Zurich; Theresa L. Baker, Northbrook, both of Ill.

[73] Assignee: Motorola, Inc., Schaumburg, Ill.

[21] Appl. No.: 08/879,880

[22] Filed: Jun. 20, 1997

Related U.S. Application Data

[62] Division of application No. 08/594,385, Jan. 31, 1996, Pat. No. 5,686,162, which is a continuation of application No. 08/312,252, Sep. 26, 1994, abandoned.

[51] Int. Cl.[7] .................................................. C08G 59/18
[52] U.S. Cl. ........................ 428/76; 174/52.2; 257/789; 257/790; 257/791; 257/795
[58] Field of Search .............................. 428/76; 257/789, 257/790, 791, 795; 174/52.2

[56] References Cited

U.S. PATENT DOCUMENTS

| | | |
|---|---|---|
| 4,529,755 | 7/1985 | Nishikawa et al. . |
| 5,104,604 | 4/1992 | Gallo . |
| 5,252,694 | 10/1993 | Willett et al. . |
| 5,258,650 | 11/1993 | Polak et al. . |
| 5,275,841 | 1/1994 | Wong . |
| 5,346,743 | 9/1994 | Uchida et al. . |

FOREIGN PATENT DOCUMENTS

| | | |
|---|---|---|
| 0448341 | 9/1991 | European Pat. Off. . |
| 59-98123 | 6/1984 | Japan . |
| 1073651 | 3/1989 | Japan . |
| 6005740 | 1/1994 | Japan . |
| 6220167 | 8/1994 | Japan . |

OTHER PUBLICATIONS

Encyclopedia of Polymer Science and Engineering, J. Wiley and Sons, 1989, vol. 5, pp. 638–641.

Encyclopedia of Polymer Science and Engineering, J. Wiley and Sons, 1989, vol. 15, pp. 270–289.

Ullmann's Encyclopedia of Industrial Chemistry, by B. Elvers, Stephen Hawkins, William Russey, Gail Schulz, VCH Verlagsgesellschaft mbH, 1993, vol. A24, pp. 57–93.

European Search Report Apr. 17, 1996, for US Parent Application Counterpart.

*Primary Examiner*—Charles Nold
*Attorney, Agent, or Firm*—Philip H. Melamed

[57] ABSTRACT

Electronic devices protected by an organic polymeric encapsulant and placed in a corrosive environment can have added protection by dispersing in the encapsulant particles of a solid buffer which tend to neutralize the effect of the corrosive agent. This approach is quite effective when strong acids are the corrosive agents, and when solid acid-base buffers are dispersed in the polymeric material. The encapsulant may be elastomeric, and silicone elastomers containing solid acid-base buffers are quite effective in protecting the underlying electronic device from corrosion by strong acids.

16 Claims, 1 Drawing Sheet

PROTECTING ELECTRONIC COMPONENTS IN ACIDIC AND BASIC ENVIRONMENT

This is a division of U.S. application Ser. No. 08/594,385, filed Jan. 31, 1996, U.S. Pat. No. 5,686,162 which is a continuation application of U.S. application Ser. No. 08/312,252, filed Sep. 26, 1994, now abandoned.

FIELD OF THE INVENTION

This invention relates to the protection of electronic components in acidic and basic environments. More particularly, our invention describes a method of imparting to conventional organic polymeric encapsulants greater protective qualities to sensitive electronic devices in the presence of a highly acidic or basic environment. Even more specifically our invention relates to elastomeric silicones affording heightened acid and base protection to encapsulated materials.

BACKGROUND OF THE INVENTION

The field of protective coatings constitutes an important use for polymeric materials, especially organic polymers. Almost from the inception of polymer science it was recognized that a polymeric coating could protect an otherwise sensitive underlying substrate from an "unfriendly" environment. Of course, this was recognized years before in various "natural" settings; e.g., aluminum is oxidation resistant principally because a thin film of alumina readily forms on all surfaces exposed to air and thereafter acts to inhibit bulk oxidation.

The rapid development of integrated circuit (IC) technology from small scale integration to very large-scale integration (VLSI) has had great technological and economic impact in the United States. The exponential growth of the number of components per IC chip and the similar decrease of minimum device dimensions have imposed stringent requirements, not only on the IC physical design and fabrication but also on the IC encapsulants.

The purpose of encapsulation is to protect electronic IC devices from moisture, ionic contaminants such as mobile sodium, potassium, and chloride ions, uv and alpha particle radiation, and other hostile operating environments including corrosive agents such as acids, bases, and oxidizing agents. In addition, encapsulation enhances the mechanical and physical properties of fragile IC devices and improves manufacturing yields and reliability. The encapsulant must be an ultrapure material with an excellent barrier to moisture and contaminant mobile ions with superior electrical, physical, and mechanical properties, and which is easy to apply and to repair in production. See *Encyclopedia of Polymer Science and Engineering*, V 5, pp 638–641, J. Wiley & Sons (1989). A variety of encapsulants, both inorganic and organic polymers, are available having a broad spectrum of properties, and generally the choice of encapsulants is made depending upon necessary properties which are a consequence of the working environment. Thus, a need for outstanding solvent resistance may dictate one type of encapsulant, whereas a need for high temperature stability may require a quite different type of encapsulant. As a general proposition it can be fairly said that the nature and properties of available encapsulants are sufficiently well known that the worker in this field can make an intelligent choice which will be well suited to the task at hand. However, occasionally particularly harsh environments make extreme physical and/or chemical demands which remain unmet by conventional materials. This application is directed to one sort of such extreme; our invention is a solution to the unusual demands of a particularly unfriendly environment.

Our specific needs arose from the problem of acids permeating through an elastomeric encapsulant to attack aluminum deposited as a metallization layer on a silicon chip, ultimately resulting in device failure through bond pad corrosion. We will describe our invention, and the problem which it solves, in the specific context in which it was encountered. However, we emphasize at the outset that our solution is a general one; it can be applied to a wide variety of organic polymeric protective coatings to impart additional protection in acidic, basic, and oxidative environments. It also should be apparent that our invention is directed to the organic polymeric material, thus is independent of the device encapsulated by the polymer. Nonetheless, solely for clarity and simplicity of exposition we shall describe our invention in the context of a particular device.

The problem whose solution is the invention of this application arose in connection with a piezoresistive transducer used as the pressure sensor on the intake manifold of an internal combustion engine. The most critical use of information from such a pressure sensor is to regulate the amount of fuel supplied to the engine by the fuel injectors, and the sensor is an integral part of the total emission control and fuel economy in automotive vehicles. The manifold absolute pressure sensor is widely held to be second in importance only to the ignition pickup device in proper operation of internal combustion engines.

The piezoresistive transducer in question, independent of associated electronics, is a monolithic silicon chip. The output voltage varies with pressure via a resistive element, acting as a strain gauge, implanted on a thin silicon diaphragm. The resulting die is aluminum metallized, with bond pads for, e.g., gold wire bonds to connect the chip to the lead frame and the die is mounted on a room temperature vulcanizing (RTV) elastomer, exemplified by a silicone or fluorosilicone, to the package base. The die, including the wire bond pads, is encapsulated in a protective polymer coating. Since the function of the die is to measure pressure, the encapsulant must not be a rigid, non-deformable polymer but instead must transmit external pressure changes to the die. Hence the encapsulant is an elastomer, which can be described variously as a rubbery, gummy, or gel-like material, and silicones, including fluorosilicones, are the elastomers of choice, in part because of their excellent resistance to water and hydrocarbon vapors which are a normal incident of the environment in which the manifold absolute pressure sensor is placed. Several configurations are possible for encapsulant(s) within the housing; these variations are unimportant for the present discussion although they will be referred to in greater detail within (vide infra).

The problem which arose was an unexpected failure of the piezoresistive transducer under certain conditions. Upon further investigation it was determined that failure occurred only in the highly acidic environments associated with high concentrations of, for example, $HNO_3$ and/or $H_2SO_4$. Closer examination showed that the failure arose specifically via corrosion at the wire bonds. Consequently, the problem was that acids or acidic gases of nitrogen and/or sulfur were permeating through the silicone elastomer used as the encapsulant and attacking the aluminum deposited during metallization, specifically at the bond pads. The aluminum layer elsewhere had a silicon nitride passivation overcoat which acted as a protectant, so only the bond pads were susceptible to corrosive attack.

The problem thus is clearly defined and its origins are well understood. Since no control over the environment is possible and since it is not feasible to further protect the aluminum at the bond pads, the solution to the problem must be directed either to eliminating or reducing permeation of acids through the encapsulant, or to neutralize acids within the encapsulating polymer. Our solution to the problem is to disperse a solid buffer within the elastomer, which certainly serves to neutralize acids but, depending upon how the elastomer is used, also may prevent permeation of the encapsulating elastomer by offending acids.

Although the foregoing background to our invention is couched as a specific problem associated with a specific device, the general problem and its solution may be readily appreciated. Thus, there is a wide spectrum of environments where the concentration of acidic or basic materials is sufficient that, upon their permeation through a protective polymer layer, the protective encapsulant and/or the underlying device may be attacked leading to corrosive failure. The general solution is to disperse in the protective polymer a solid acting as a buffer with respect to the corrosive agent.

Throughout this application we use "buffer" in its most extended chemical sense, i.e., a substance which resists a change in hydrogen ion concentration upon addition of acids or alkali, or a substance which resists a change in oxidation potential. The former is more generally intended within this application; this class is referred to as "acid-base buffers." Unless "oxidation-reduction buffer" is specified "buffer" shall mean an "acid-base buffer."

DESCRIPTION OF THE INVENTION

Figure 1:
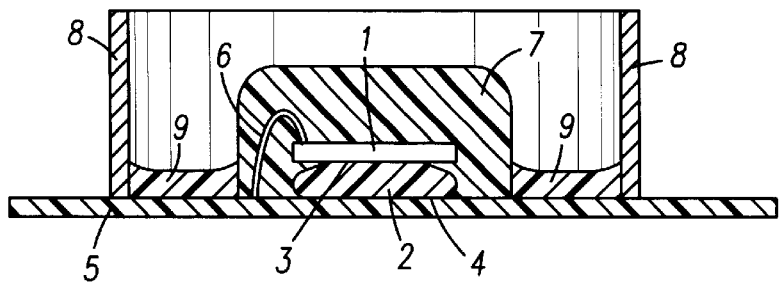
FIG. 1 is a side view of an encapsulated device according to the prior art.

In most general terms our invention is a method of either inhibiting permeation of agents corrosive to the material of construction of integrated circuits through the polymeric material encapsulating the integrated circuit, or a method of neutralizing a corrosive agent within the encapsulant, by dispersing a buffer within the encapsulating polymer itself or by providing the encapsulant with a protective polymeric coating containing the buffer. The corrosive agent is an acid, base, or oxidant. In a specific embodiment the corrosive agent is an acid. In a more specific embodiment the corrosive agent is an acidic material typically found in the manifold intake of internal combustion engines. In another specific embodiment the polymeric encapsulant is an elastomer. In a yet more specific embodiment the elastomer is a silicone. In yet another specific embodiment the buffer consists of solid particles of, for example, alumina, or magnesia, Hydrates.

A different set of embodiments, directed to the inhibition of permeation of corrosive agents into the encapsulating layer, constitutes a second, protective polymer layer over the encapsulating polymer, where the protective layer contains a buffer. In this way the corrosive agent is prevented from reaching the encapsulating polymer. In a specific embodiment both the protective and encapsulating polymers are elastomers. In a more specific embodiment of this variant of our invention both elastomeric polymers are silicones. In a still more specific embodiment the buffer is a dispersion of solid particles of alumina, or magnesia, hydrates.

It is well known that integrated circuits generally are encapsulated, most frequently in organic polymers, to protect them from various agents normally found in their operating environment. The polymers used as encapsulants are too well known to necessitate an extensive description here. See *Encyclopedia of Polymer Science and Engineering*, V 5, pp 638–641, J. Wiley & Sons (1989), and references cited therein. Of particular interest to us here are elastomers used as encapsulants, and within this group the silicones, including fluorosilicones, are the outstanding examples of elastomers which may be used for this purpose. See, for example, "*Encyclopedia of Polymer Science and Engineering*", V 15, pp 270–289, John Wiley & Sons (1989); "*Ullman's Encyclopedia of Industrial Chemistry*," V A24, pp 57–93, Verlagsgesellschaft mbH (1993) and references cited therein. As the foregoing references make clear, "silicones" is a generic term applied to silicon-based polymers generally, and includes materials variously described as siloxanes, polysiloxanes, polyfluorosiloxanes, inter alia, within the class.

The purpose of polymeric encapsulants is to protect the underlying integrated circuit from corrosive agents and other agents which interfere with normal functioning of the integrated circuit. For example, water and alkali metal cations are well known interfering agents, although they are not normally considered as corrosive agents. Among the corrosive agents of importance here are acids, bases, and oxidizing agents, but most importantly acids. Of the acids which can act as corrosive agents the following may be mentioned; nitric acid (and the oxides of nitrogen generally), sulfuric acid (and the oxides of sulfur generally), hydrochloric acid, phosphoric acids, and organic acids to a lesser extent. Nitric and sulfuric acids are of principal interest here for they, along with the other acidic oxides of nitrogen and sulfur, are most likely to be found in the intake manifold of internal combustion engines. Among bases which may serve as corrosive agents may be mentioned the alkali metal hydroxides generally and ammonia. Among the oxidizing agents which can serve as corrosive agents may be mentioned nitrogen oxides generally, especially the higher nitrogen oxides such as $NO_2$ and $N_2O_3$.

Our solution to the problems expounded in greater detail above is to disperse a solid buffer in the elastomer. As stated previously, a buffer is a substance which resists a change in hydrogen ion concentration upon the addition of acid or alkali, or which resists a change in oxidation potential, but for use in our invention the buffer must be material which does not interfere with the formation of the polymer or significantly change the properties of the polymeric material when incorporated therein. Because aluminum oxide hydrates are amphoteric, i.e., can act either as an acid or base under appropriate conditions, we have found that aluminum oxide and its hydrates are outstanding acid-base buffers in the practice of our invention. Other acid buffers which may be used in our invention include the hydrates of magnesium and calcium oxides, borates of alkali metals, acetates (and carboxylates generally) of alkali metals, potassium dihydrogen phosphate-disodium phosphate ($KH_2PO4$—$Na_2HPO4$), potassium acid phosphate-sodium hydroxide, borax, boric acid-sodium hydroxide, calcium carbonate-calcium hydrogen carbonate, and so forth. Basic buffers include such materials as primary potassium citrate, secondary sodium citrate, and tris-(hydroxymethyl)aminomethane and its hydrochloride, and sodium carbonate-sodium hydroxide. See generally D. D. Perrin and B. Dempsey, "*Buffers for pH and Metal Ion Control*", (1979). Particle sizes in the range of 0.02–50 microns in diameter may be used in the practice of our invention, although it is recommended that particles be in the 0.5–10 micron diameter range. Buffers may be added in an amount, relative to the elastomer or other polymeric encapsulant, as low as 1 weight percent up to as high as 25 weight percent, but additions of 10–20 weight percent are preferred.

There are several distinct schemes by which the buffer may be incorporated into a protective polymer to afford effective protection, and these different modes are depicted, along with the present, conventional mode offering no protection, in FIGS. 1–4. FIG. 1 represents the prior art. The electronic device 1, which in the case of immediate interest is a piezoresistive transducer, is mounted on a cushion 2, or a thick disk, of a suitable elastomer, generally a room temperature vulcanized silicone. The device is placed on the top surface 3 of the disk whose bottom surface 4 is attached to circuit board 5. Wire connectors, here represented by the single connector 6, lead from the device via bond pads (not shown) to the circuit board. The entire device, including wire connectors, is encapsulated in a suitable protective polymeric coating 7. Where, as here, the device function is to transmit pressure changes the protective polymeric coating must itself be readily deformable and compliant so as to accurately transmit pressure changes to the encapsulated device. Consequently, the encapsulating polymer in this case is elastomeric, and silicones constitute the outstanding example of elastomeric encapsulants used in devices of this type.

Typically the entire device, including its encapsulating layer, is housed in a semi-enclosed structure, i.e., one enclosed on three sides but open on the fourth so as to be in communication with the pressure source. As shown in FIG. 1 this may be accomplished by having the circuit board as one of the closed sides and having the sides of a cylinder surrounding the device and itself connected to the circuit board form the other sides 8 completing the enclosure. Because the function of the piezoelectric transducer is to sense absolute pressure it is critical that the entire structure be leak-proof A sealing gel 9 often is placed as a continuous, pressure-tight film between the encapsulated device and the cylinder sides 8, thereby effectively sealing the housing at places prone to leaks.

Figure 2:
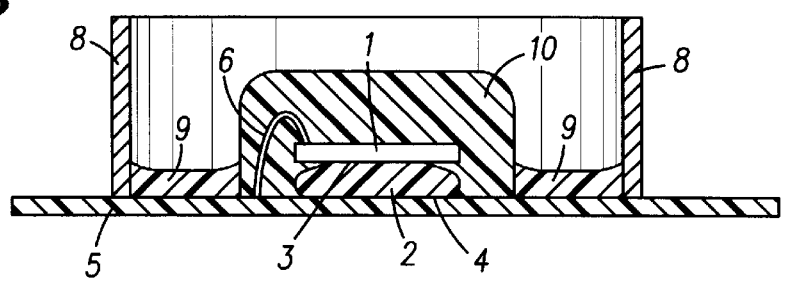
FIGS. 2–4 are embodiments of an encapsulated device protected against corrosive agents according to our invention.

One mode of practicing our invention is to incorporate the buffer directly into the encapsulant, as depicted in FIG. 2. This variant is unquestionably the simplest to effect, since it requires minimal changes in the overall manufacturing process. The sole difference between this variant and that depicted in FIG. 1 is the presence of a solid buffer dispersed (more-or-less uniformly) within the protective polymeric coating, i.e., the encapsulating polymer 10 is different from 7 in having present a dispersion of solid buffer particles. In this variant the buffer acts to neutralize the corrosive agent permeating the encapsulating polymer and prevents corrosive attack on the underlying device. Where the corrosive agent is an acid, which represents perhaps the chief problem, the solid buffer serves to neutralize the acid. Note that if the encapsulating polymer itself is sensitive to the corrosive agent it may undergo chemical attack, even as severe as depolymerization, leading to significant physical changes in the polymer and altering its properties in ways which may themselves be detrimental to the underlying IC.

Figure 3:
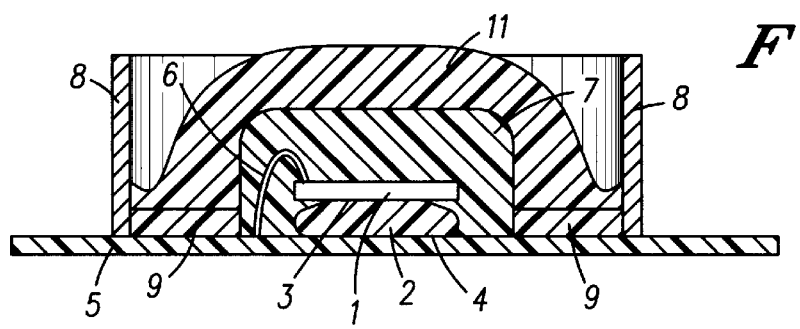

The foregoing variant places the solid buffer in contact with, or in the immediate environment of, the IC which itself may not be desirable. For this reason the variants depicted in FIGS. 3 and 4 may serve as alternatives. Both cases represent a layered, polymeric protective coating for electronic devices comprising an inner polymeric layer in contact with and encapsulating the device, and an outer polymeric layer interposed between the inner layer and the environment, where the outer polymeric layer 11 contains a dispersion of a solid buffer. Turning first to FIG. 3, what is depicted is a structure very similar to that of FIG. 1 except that overlaying both the sealing gel 9 and the encapsulant 7 is another polymeric layer 11 which contains a uniform dispersion of solid buffer. Note that there is retained a separate sealing gel and the outer, buffered protective polymeric layer effectively isolates both the encapsulant and the seal gel from the environment. In this way one can choose as a sealant material most suited for its sealing properties and one need not be concerned with the effect, if any, on the integrity of pressure-sealing by the solid buffer particles dispersed in the polymer. In this variation and the subsequent one as well the outer, buffered polymeric protective layer prevents or inhibits permeation of corrosive materials into the encapsulating polymer by neutralizing the offending corrosive agent. Thus, the encapsulant "sees" a corrosive-free environment; this variant may be viewed as effectively changing the environment in which the encapsulant is placed. Note that this variant, as with the following one, actually prevents permeation of corrosive materials through the encapsulating polymeric layer by neutralizing the corrosive agents prior to their reaching the encapsulant. It also will be recognized that the solution represented by FIG. 3 represents perhaps the mildest perturbation to existing manufacturing methods; little needs to be changed other than adding an additional protective coating to the housing. Where the encapsulated device measures pressure changes it follows that the outer protective polymeric layer also needs to be elastomeric in order to adequately transmit pressure changes to the encapsulated device.

Figure 4:
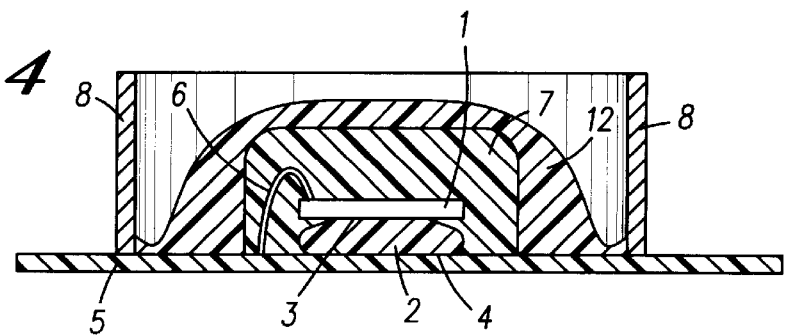

FIG. 4 depicts a mode where the buffer is incorporated into an elastomer which provides both an outer, protective layer to the encapsulant itself and which also acts as the seal gel. In this variation, as in the previous one, the outer buffered protective polymer layer 12 prevents or inhibits permeation of corrosive materials into the encapsulating polymer by neutralizing the offending corrosive agent while acting as a sealing agent. Thus, the environment presented to the encapsulant is free of corrosive agents. This variant also may be viewed as effectively changing the environment in which the encapsulant is placed. Note that in this variant, as in the prior one, the outer protective polymeric layer also must be an elastomer which readily transmits pressure changes, and in general must function in this regard identically to the encapsulant.

The foregoing has been couched largely in terms of a device having an elastomeric protective polymeric coating. However, as stated earlier our invention is far broader than this and extends to all manner of polymeric coatings which are permeable to corrosive agents which attack the underlying IC. Whether the corrosive agent is acidic, basic, or an oxidant is not particularly pertinent to the overall invention, although it is clear that particular embodiments will reflect the nature of the corrosive agent. Thus, one skilled in the art readily recognizes that where the corrosive action arises via an acid the buffer must be an acid-base buffer tending to neutralize the acidic medium. Similarly, where the corrosive action arises via a base the buffer must be an acid-base buffer tending to neutralize the basic medium. Finally, where the corrosive action arises via an oxidant the buffer must be capable of reducing the oxidation potential so as to inhibit corrosion of the IC.

The following examples are only illustrative of our invention and do not limit it in any way.

EXAMPLES

Prior Art Method

A silicone adhesive acting as a cushion for the piezoresistive transducer die is dispensed onto an alumina substrate, and the die is placed on the top surface of the adhesive. After the silicone is cured, the die is wire bonded to the substrate. A thixotropic fluorinated siloxane (polyfluorosiloxane) is then dispensed on top of the die and wire bonds and cured to serve as the encapsulant; see FIG. 1. A second fluorosiloxane, serving as the sealing gel, is then dispensed into the can and cured. A standardized, accelerated test was devised to determine failure time for these devices in the presence of nitric acid. Under standard test conditions devices prepared as above failed within 125 hours.

Method of the Invention

Preparation of the device begun as described above with deposit of a silicone adhesive as a cushion for the piezoresistive transducer die, placement of the die on the adhesive, and curing. A buffered gel was prepared by adding under vacuum to the fluorinated siloxane of the prior art method 7.5 weight percent each (based on final product gel) magnesium hydroxide and aluminum hydroxide. Additional Pt catalyst was added, to compensate for poisoning caused by the buffer, in an amount from 0.001–0.2 weight percent, but generally in the range of 0.01–0.1 weight percent. There was also added an inhibitor to give the polymer a useful pot life, and about 3 weight percent silica was added to give the siloxane thixotropic properties. The mixture was stirred under vacuum until a homogeneous paste was formed, thereafter dispensed on top of the die and wire bonds as described above, and then cured. A sealing gel was subsequently dispensed into the can as described above. Under the same standardized accelerated test conditions the buffered gel configured devices had a lifetime of 400–500 hours. Thus, lifetimes could be extended by 3- to 4-fold by incorporation of a suitable buffer in the encapsulating polymer.

Similar devices were prepared using an ultraviolet-curable polysiloxane. Such devices showed excellent acid resistance, but poorer gasoline resistance than the devices prepared above. A fluorosiloxane-encapsulated device using calcium carbonate-calcium hydrogen carbonate as the buffer also showed excellent acid protection.

What is claimed is:

1. A layered, elastomeric coating for protecting devices located in an environment containing at least one corrosive agent selected form the group of acids, bases, and oxidants, comprising an inner first organic elastomeric layer in contact with and encapsulating said electronic device, and an outer second organic elastomeric layer interposed between said inner layer and the environment, said outer second organic elastomeric layer containing a dispersion of a solid buffer effective to neutralize the corrosive agent.

2. The coating of claim 1 where the elastomeric coating is a silicone.

3. The coating of claim 2 where the elastomeric coating is a polyfluorosiloxane.

4. The coating of claim 1 where the corrosive agent is an acid.

5. The coating of claim 1 where the solid buffer is an acid-base buffer.

6. The coating of claim 5 where the solid buffer is selected from the group consisting of the hydrated aluminum, calcium and magnesium, or the borates of alkali metals, carboxylates of alkali metals, potassium dihydrogen phosphate-disodium phosphate, potassium dihydrogen phosphate-sodium hydroxide, borax, boric acid-sodium hydroxide, and calcium carbonate-calcium hydrogen carbonate.

7. The coating of claim 1 where the particles have a diameter between about 0.02 and about 50 microns.

8. The coating of claim 1 where the solid buffer is added in an amount from about 1 up to about 25 weight percent of the elastomeric coating.

9. A layered, elastomeric coating for protecting electronic devices located in an environment containing at least one corosive agent selected from the group of acids, bases, and oxidants, comprising an inner first organic elastomeric layer in contact with and encapuslating said electronic device, and an outer second organic elastomeric layer interposed between said inner layer and the environment, said outer second organic elastomeric layer containing a dispersion of a solid buffer effective to neutralize the corrosive agent, wherein the inner first organic elastomeric layer differing from the outer second organic elastomeric layer in that the outer second elastomeric layer differing from the outer second organic elastomeric layer in that the outer second elastomeric layer contains said dispersion of solid buffer.

10. The coating of claim 9 where the elastomeric coating is a silicone.

11. The coating of claim 10 where the elastomeric coating is a polyfluorosiloxane.

12. The coating of claim 9 where the corrosive agent is an acid.

13. The coating of claim 9 where the solid buffer is an acid-base buffer.

14. The coating of claim 13 where the solid buffer is selected from the group consisting of the hydrated oxides of aluminum, calcium and magnesium, the borates of alkali metals, carboxylates of alkali metals, potassium dihydrogen phosphate-disodium phosphate, potassium dihydrogen phosphate-sodium hydroxide, borax, boric acid-sodium hydroxide, and calcium carbonate-calcium hydrogen carbonate.

15. The coating of claim 9 where the particles have a diameter between about 0.02 and about 50 microns.

16. The coating of claim 9 where the solid buffer is added in an amount from about 1 up to about 25 weight percent of the elastomeric layer.

* * * * *